US009536598B2

(12) United States Patent
Wu et al.

(10) Patent No.: US 9,536,598 B2
(45) Date of Patent: *Jan. 3, 2017

(54) MEMORY ARRANGEMENT

(71) Applicant: Taiwan Semiconductor Manufacturing Company Limited, Hsin-Chu (TW)

(72) Inventors: Wei-Cheng Wu, Hsinchu (TW); Yen-Huei Chen, Jhudong Township (TW); Hung-Jen Liao, Hsin-chu (TW)

(73) Assignee: Taiwan Semiconductor Manufacturing Company Limi, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/886,475

(22) Filed: Oct. 19, 2015

(65) Prior Publication Data
US 2016/0042786 A1 Feb. 11, 2016

Related U.S. Application Data

(63) Continuation of application No. 14/052,745, filed on Oct. 13, 2013, now Pat. No. 9,165,623.

(51) Int. Cl.
| G11C 7/22 | (2006.01) |
|---|---|
| G11C 11/419 | (2006.01) |
| G11C 8/08 | (2006.01) |
| G11C 5/02 | (2006.01) |
| G11C 11/418 | (2006.01) |
| G11C 8/10 | (2006.01) |

(52) U.S. Cl.
CPC .............. *G11C 11/419* (2013.01); *G11C 5/02* (2013.01); *G11C 7/22* (2013.01); *G11C 8/08* (2013.01); *G11C 8/10* (2013.01); *G11C 11/418* (2013.01)

(58) Field of Classification Search
CPC .................................... G11C 5/02; G11C 7/22
USPC ............................................... 365/51, 189.05
See application file for complete search history.

(56) References Cited

U.S. PATENT DOCUMENTS

| 4,463,448 | A | * | 7/1984 | Sugo | ..................... G11C 11/415 365/190 |
|---|---|---|---|---|---|
| 5,706,245 | A | * | 1/1998 | Kim | ......................... G11C 8/10 365/230.03 |
| 6,037,638 | A | * | 3/2000 | Abe | ........................ H01L 27/11 257/393 |
| 7,570,540 | B2 | * | 8/2009 | Nii | ........................... G11C 8/10 365/154 |
| 7,696,063 | B2 | * | 4/2010 | Tsuchiya | ............. H01L 21/8221 257/52 |
| 8,295,099 | B1 | * | 10/2012 | Yachareni | ................ G11C 8/16 365/189.04 |

* cited by examiner

*Primary Examiner* — Michael Tran
(74) *Attorney, Agent, or Firm* — Cooper Legal Group, LLC

(57) ABSTRACT

Among other things, techniques and systems are provided for activating a memory cell of a memory arrangement in preparation for at least one of a read operation or write operation. The memory arrangement comprises a word-line driver comprising at least a first input terminal and a second input terminal. The first input terminal is operably coupled to a first decoder and the second input terminal is operably coupled to a second decoder. When the word-line driver senses a first voltage at the first input terminal and a second voltage at the second input terminal, the word-line driver outputs a gate voltage signal which activates the memory cell.

22 Claims, 7 Drawing Sheets

MEMORY ARRANGEMENT

RELATED APPLICATION

This application is a continuation of and claims priority to U.S. Pat. application 14/052,745, titled "Memory Arrangement" and filed on Oct. 13, 2013, now issued as U.S. Pat. No. 9,165,623, which is incorporated herein by reference.

BACKGROUND

A memory arrangement is configured to store content in the form of bits. Typically, the memory arrangement comprises a plurality of memory cells respectively configured to store a bit of data. At times when it is desirable to read a stored bit of data, a read operation is performed on the memory cell. At times when it is desirable to write a bit of data to the memory cell, a write operation is performed. Read and write operations are typically controlled through the application of specific voltages to the memory cell.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

According to some embodiments, a memory arrangement comprising a first memory cell and a first word-line driver is provided. The first word-line driver is configured to control activation of the first memory cell in preparation for at least one of a read operation or a write operation and is operably coupled to a first decoder and a second decoder. As an example, the first word-line driver comprises a logic gate, such as an AND gate or a NOR gate, comprising at least two input terminals. The first decoder is configured to apply a first voltage signal to a first input terminal and the second decoder is configured to apply a second voltage signal to a second input terminal. When the logic gate senses that the first voltage signal is HIGH while concurrently sensing that the second voltage signal is HIGH, the logic gate generates a HIGH gate voltage signal which activates the first memory cell to facilitate performance of at least one of the read operation or the write operation. In this way, the first word-line driver controls the activation of the first memory cell as a function of at least two independently controlled voltage signals, for example. Further, controlling the activation of the first memory cell as a function of at least two independently controlled voltage signals has, in some embodiments, an advantage of inhibiting read disturbs caused when one or more unselected memory cells, coupled to a same word-line as a memory cell upon which a read operation or a write operation is performed, is inadvertently activated.

In some embodiments, the memory arrangement comprises multiple physical layers and the first memory cell is situated on a different physical layer than the first word-line driver. By way of example, a plurality of memory cells, including the first memory cell, are situated on a first physical layer of the memory arrangement, and a plurality of word-line drivers, including the first word-line driver, are situated on a second physical layer. In some embodiments, respective word-line drivers are configured to control the activation of merely one memory cell situated on the first physical layer. Thus, in such embodiments, there is a one-to-one ratio between word-line drivers and memory cells.

In some embodiments, the memory arrangement comprises multiple physical layers on which memory cells are situated. For example, a first physical layer comprises a first memory array of memory cells, including the first memory cell, operably coupled to a first input/output circuit and a third physical layer comprises a second memory array of memory cells operably coupled to a second input/output circuit. In some embodiments, the first word-line driver is configured to control activation of merely one memory cell situated on respective physical layers. Thus, the first word-line driver controls the activation of the first memory cell situated on the first physical layer and the activation of another memory cell situated on the third physical layer, for example.

The following description and annexed drawings set forth certain illustrative aspects and implementations. These are indicative of but a few of the various ways in which one or more aspects are employed. Other aspects, advantages, and novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and structures of the drawings are not necessarily be drawn to scale. Accordingly, the dimensions of the various features is arbitrarily increased or reduced for clarity of discussion.

DETAILED DESCRIPTION

Figure 1:
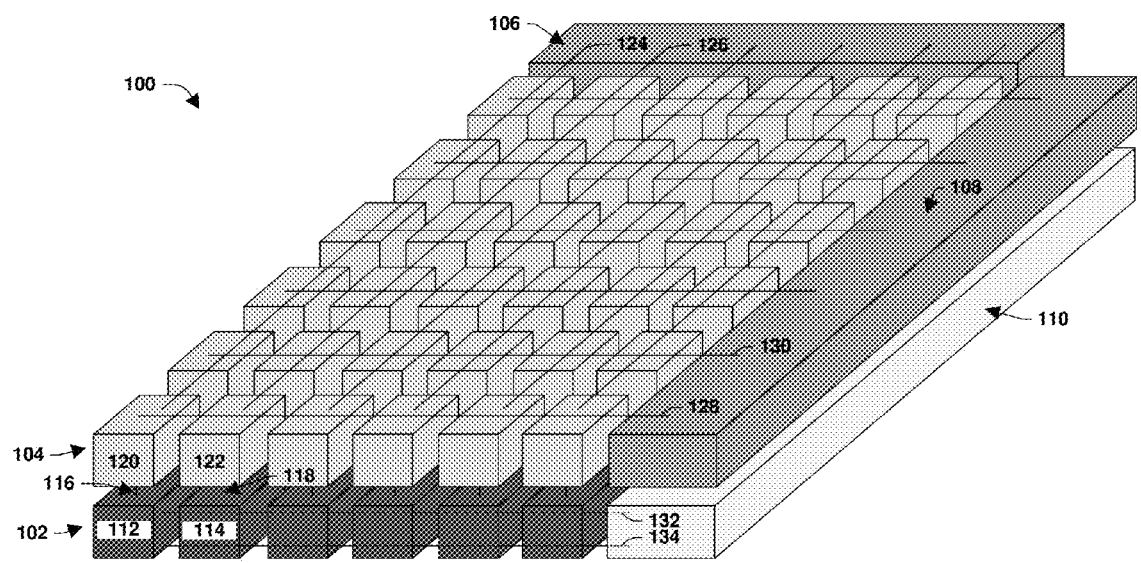
FIG. 1 illustrates a memory arrangement according to some embodiments.

Embodiments or examples, illustrated in the drawings are disclosed below using specific language. It will nevertheless be understood that the embodiments or examples are not intended to be limiting. Any alterations and modifications in the disclosed embodiments or examples, and any further applications of the principles disclosed in this document are contemplated as would normally occur to one of ordinary skill in the pertinent art.

Referring to FIG. 1, a component block diagram of an example memory arrangement 100 according to some embodiments is provided. The memory arrangement 100 comprises a memory array 102, a driver array 104, a first decoder 106, a second decoder 108, and an input/output (I/O) circuit 110.

In some embodiments, the memory array 102 is situated on a different physical layer of the memory arrangement 100 than the driver array 104. By way of example, the memory array 102 is situated on a first physical layer of the memory arrangement 100 and the driver array 104 is situated on a second physical layer. In other embodiments, the memory array 102 is situated on a same physical layer of the memory arrangement 100 as the driver array 104.

In some embodiments, at least one of the first decoder 106 or the second decoder 108 are situated on a same physical layer as the driver array 104. In other embodiments, the first decoder 106 and the second decoder 108 are situated on a different physical layer or different physical layers than the driver array 104.

In some embodiments, the I/O circuit 110 is situated on a same physical layer as the memory array 102. In other embodiments, the I/O circuit 110 is situated on a different physical layer than the memory array 102.

The memory array 102 comprises a plurality of memory cells, including a first memory cell 112 and a second memory cell 114. Respective memory cells of the memory array 102 are configured to store content, such as a bit of data. In some embodiments, the memory cells are configured as static random access memory (SRAM) cells. In some embodiments, the memory array 102 is formed, at least in part, via a complementary metal-oxide-semiconductor (CMOS) process.

Word-lines are operably coupled to respective memory cells of the memory array 102. By way of example, a first word-line 116 is operably coupled to the first memory cell 112 and a second word-line 118 is operably coupled to the second memory cell 114. Respective memory cells of the memory array 102 are configured to be activated in preparation for at least one of a read operation or a write operation via a gate voltage signal applied through the word-line to which the memory cell is coupled. By way of example, a first gate voltage signal applied through the first word-line 116 controls activation of the first memory cell 112 and a second gate voltage signal applied through the second word-line 118 controls activation of the second memory cell 114.

The driver array 104 comprises a plurality of word-line drivers, including a first word-line driver 120 and a second word-line driver 122. Respective word-line drivers comprise at least two input terminals and at least one output terminal. The output terminal of respective word-line drivers is operably coupled to a word-line. For example, an output terminal of the first word-line driver 120 is operably coupled to the first word-line 116 and an output terminal of the second word-line driver 122 is operably coupled to the second word-line 118. In this way, via a word-line, respective word-line drivers are operably coupled to at least one memory cell. As an example, the first word-line driver 120 is operably coupled to the first memory cell 112 via the first word-line 116, and the second word-line driver 122 is operably coupled to the second memory cell 114 via the second word-line 118.

Respective word-line drivers are configured to control the activation of at least one memory cell via a gate voltage signal output by respective word-line drivers. For example, the first word-line driver 120 is configured to control the activation of the first memory cell 112 using a first gate voltage signal and the second word-line driver 122 is configured to control the activation of the second memory cell 114 using a second gate voltage signal. An amplitude of a gate voltage signal is a function of a first voltage signal applied to the first input terminal of the word-line driver outputting the gate voltage signal and a second voltage signal applied at the second input terminal of the word-line driver outputting the gate voltage signal. In some embodiments, an amplitude of the first voltage signal and an amplitude of the second voltage signal is sensed or measured by one or more logic gates of the word-line driver. By way of example, the first word-line driver 120 comprises a two-input AND gate. When the first voltage signal applied to the first input terminal of the first word-line driver 120 is HIGH and the second voltage signal applied to the second input terminal of the first word-line driver 120 is HIGH, an amplitude of the gate voltage signal output by the first word-line driver 120 is HIGH, causing the first memory cell 112 to activate. When at least one of the first voltage signal or the second voltage signal is LOW, the amplitude of the gate voltage signal is LOW, causing the first memory cell 112 to deactivate. Other available logic gates include OR gates, NAND gates, NOR gates, XOR gates, and XNOR gates, for example. Moreover, while reference is made to activating the first memory cell 112 when the gate voltage signal applied thereto is HIGH, in some embodiments, the first memory cell 112 is activated when the gate voltage signal is LOW.

In some embodiments, respective word-line drivers are configured to control activation of merely one memory cell of the memory array 102. By way of example, the first word-line driver 120 controls activation of merely the first memory cell 112 of the memory array 102. That is, stated differently, the first word-line driver 120 is configured to not activate the one or more other memory cells situated on the first physical layer that are part of the memory array 102. Thus, in some embodiments, there is a one-to-one ratio between the number of word-line drivers that comprise the driver array 104 and the number of memory cells that comprise the memory array 102. In other embodiments, one or more word-line drivers are configured to control the activation of at least two memory cells of the memory array 102.

In some embodiments, memory cells of the memory array 102 or word-line drivers of the driver array 104 are arranged in a grid pattern having rows and columns. For purposes of the instant application, rows extend horizontally on the page and columns extend vertically on the page. In other embodiments, the memory cells or the word-line drivers are arranged according to a different pattern. As an example, the word-line drivers or the memory cells are arranged to form a toroid.

The first input terminal of respective word-line drivers is operably coupled to the first decoder 106. In some embodiments, a plurality of word-line drivers are operably coupled to the first decoder 106 in a series arrangement, where a voltage signal is applied by the first decoder 106 to a plurality of word-line drivers concurrently. By way of example, a first line 124 operably couples word-line drivers of a first column, including the first word-line driver 120, to the first decoder 106 and a second line 126 operably couples word-line drivers of a second column, including the second word-line driver 122, to the first decoder 106. Accordingly, a voltage signal applied through the first line 124 is concurrently applied to word-line drivers of the first column and a voltage signal applied through the second line 126 is concurrently applied to word-line drivers of the second column.

The second input terminal of respective word-line drivers is operably coupled to the second decoder 108. In some embodiments, a plurality of word-line drivers are operably coupled to the second decoder 108 in a series arrangement, where a voltage signal is applied by the second decoder 108 to a plurality of word-line drivers concurrently. By way of example, a third line 128 operably couples word-line drivers of a first row, including the first word-line driver 120 and the second word-line driver 122, to the second decoder 108 and a fourth line 130 operably couples word-line drivers of a second row to the second decoder 108. Accordingly, a voltage signal applied through the third line 128 is concurrently applied to word-line drivers of the first row and a voltage signal applied through the fourth line 130 is concurrently applied to word-line drivers of the second row.

The I/O circuit 110 is configured to perform at least one of read operations or write operations on respective memory cells of the memory array 102 and is operably coupled to respective memory cells via bitlines and bitline-bars. In some embodiments, a plurality of memory cells is operably coupled to the I/O circuit 110 in a series arrangement. By way of example, a first bitline 132 and a first bitline-bar 134 operably couple memory cells of the first row, including the first memory cell 112 and the second memory cell 114, to the I/O circuit 110. As another example, a second bitline and a second bitline bar operably couple memory cells of the second row to the I/O circuit 110.

An example read operation using the memory arrangement 100 is as follows. A processor, for example, desires to read content stored in the first memory cell 112, which is associated with a column address and a row address. The processor provides the column address to the first decoder 106 and provides the row address to the second decoder 108 and the I/O circuit 110. The first decoder 106 applies a first voltage, such as a HIGH voltage, to the first line 124 corresponding to the column address while applying a second voltage, such as a LOW voltage, to other lines, including the second line 126. Moreover, the second decoder 108 applies a third voltage, such as a HIGH voltage, to the third line 128 corresponding to the row address while applying a fourth voltage, such as a LOW voltage, to other lines, including the fourth line 130. Accordingly, the first word-line driver 120, operably coupled to the first memory cell 112, receives the first voltage and the third voltage, such as two HIGH voltages, while other word-line drivers of the driver array 104 receive at least one of the second voltage or the fourth voltage, thus receiving at least one LOW voltage. Responsive to the first voltage and the third voltage being applied to the first word-line driver 120, the first word-line driver 120 outputs a HIGH gate voltage signal, which is applied to the first memory cell 112 and causes the first memory cell 112 to be activated. By way of example, the HIGH gate voltage signal causes one or more transistors of the first memory cell 112 to turn-on and facilitate a read operation by the I/O circuit 110. In some embodiments, a write operation is performed following a similar process except that the I/O circuit performs a write operation, instead of a read operation, while the first memory cell 112 is activated.

Figure 2:
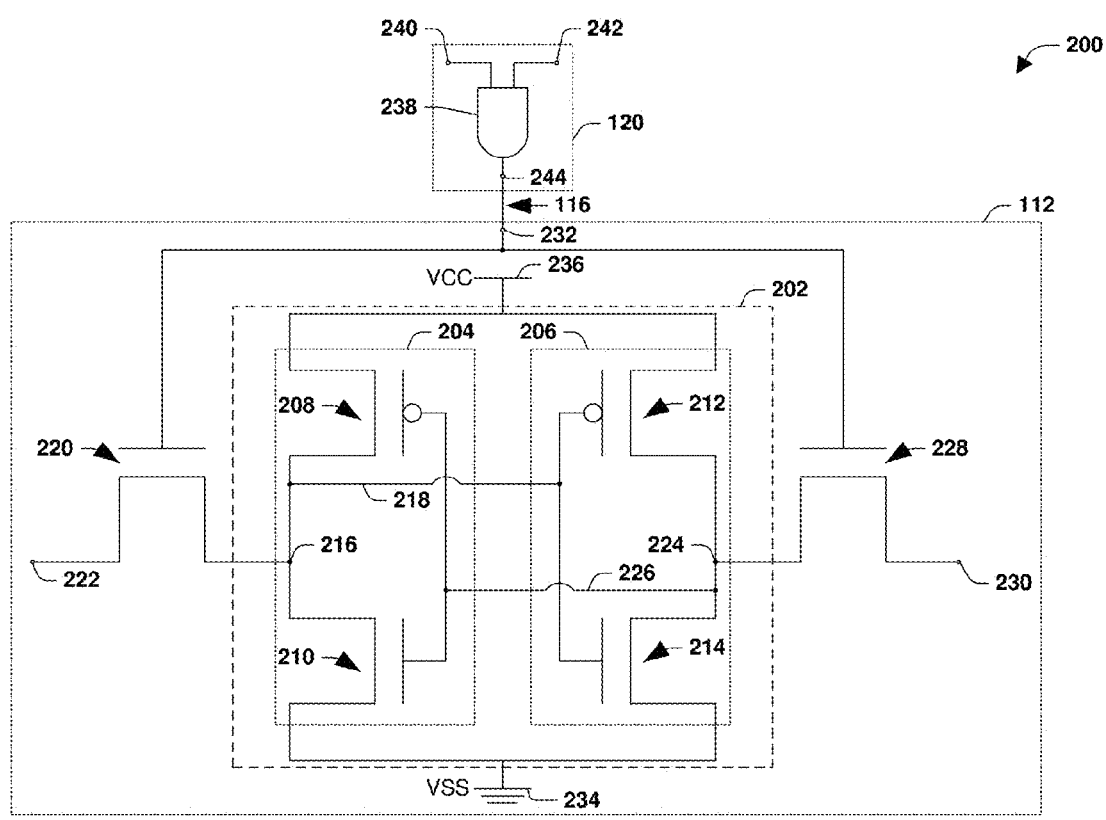
FIG. 2 illustrates a circuit diagram of a portion of a memory arrangement according to some embodiments.

FIG. 2 illustrates a circuit diagram 200 of a portion of an example memory arrangement, such as a portion of the memory arrangement 100 of FIG. 1. More particularly, a circuit diagram 200 of the first memory cell 112, the first word-line 116, and the first word-line driver 120 according to some embodiments is provided.

In some embodiments, the first memory cell 112 is arranged as a six-transistor (6T) SRAM cell. In other embodiments, the first memory cell is arranged differently. By way of example, in some embodiments, the first memory cell 112 is arranged as a five-transistor (5T) SRAM cells or as an eight-transistor (8T) SRAM cell.

The first memory cell 112 comprises a latch portion 202 comprising a first inverter 204 and a second inverter 206. In some embodiments, the first inverter 204 and the second inverter 206 are cross-coupled via a first cross-coupling element 218 and a second cross-coupling element 226. The first inverter 204 comprises a first pull-up transistor 208 and a first pull-down transistor 210, and the second inverter 206 comprises a second pull-up transistor 212 and a second pull-down transistor 214. Example pull-up transistors 208, 212 and pull-down transistors 210, 214 include p-type field effect transistors (pFETs), n-type field effect transistors (nFETs), p-type metal-oxide semiconductor field effect transistors (pMOSFETs), n-type metal-oxide semiconductor field effect transistors (nMOSFETs), an arrangement of two or more FETs or MOSFETs, etc.

A first memory node 216 is formed at the first inverter 204 between the first pull-up transistor 208 and the first pull-down transistor 210. In some embodiments where the first inverter 204 and the second inverter 206 are cross-coupled, the first memory node 216 is coupled to a gate of the second pull-up transistor 212 and a gate of the second pull-down transistor 214 via the first cross-coupling element 218.

The first memory node 216 is written to and read from through a first access transistor 220, which is configured to control access, of I/O circuit 110, to the first memory node 216. The first memory node 216 is coupled, through the first access transistor 220, to the first bitline 132 at a first terminal 222.

A second memory node 224 is formed at the second inverter 206 between the second pull-up transistor 212 and the second pull-down transistor 214. In some embodiments where the first inverter 204 and the second inverter 206 are cross-coupled, the second memory node 224 is coupled to a gate of the first pull-up transistor 208 and a gate of the first pull-down transistor 210 via the second cross-coupling element 226.

The second memory node 224 is written to and read from through a second access transistor 228, which is configured to control access, of the I/O circuit 110, to the second memory node 224. The second memory node 224 is coupled, through the second access transistor 228, to a first bitline-bar 134 via a second terminal 230.

Example configurations for the first access transistor 220 and the second access transistor 228 include pFET configurations, nFET configurations, pMOSFET configurations, nMOSFET configurations, or other configurations configured to selectively couple the first bitline and the first bitline-bar to the latch portion 202. A gate of the first access transistor 220 and a gate of the second access transistor 228 are mutually coupled to the first word-line 116 via a third terminal 232.

The first word-line driver 120 comprises a logic gate 238, such as an AND gate, a first input terminal 240, a second input terminal 242, and a first output terminal 244. The first input terminal 240 is operably coupled to the first decoder 106 via the first line 124 through which a first voltage signal is applied to the logic gate 238. The second input terminal 242 is operably coupled to the second decoder 108 via the third line 128 through which a second voltage signal is applied to the logic gate. The first output terminal 244 is operably coupled to the third terminal 232 of the first memory cell 112 via the first word-line 116 through which a first gate voltage signal is applied to the third terminal 232.

An example operation is as follows. For this example, the first gate voltage signal is initially LOW, causing the first access transistor 220 and the second access transistor 228 to be deactivated or turned-off. Further, the first memory node 216 is at a high voltage state. As a result, the second pull-up transistor 212 is turned-off and the second pull-down transistor 214 is turned-on. Accordingly, a voltage at the second memory node 224 is pulled to ground (VSS) 234. Such a low voltage state at the second memory node 224 turns on the first pull-up transistor 208 and turns off the first pull-down transistor 210, causing the first memory node 216 to be sustained at the high voltage state via the voltage supply (VCC) 236. When the second memory node 224 is at a high voltage state, the opposite effect occurs, causing the second memory node 224 to be sustained at the high voltage state via the voltage supply 236 while the first memory node 216 is sustained at the low voltage state via ground 234.

During a read operation or a write operation, the first decoder 106 and second decoder 108 concurrently apply HIGH voltages to the logic gate 238 via the first input terminal 240 and the second input terminal 242, causing the first gate voltage signal to go HIGH. The HIGH gate voltage signal causes the first access transistor 220 and the second access transistor 228 to be activated. In this way, the I/O circuit 110 is granted access to the first memory node 216 and the second memory node 224. A logic state of the first memory node 216 and the second memory node 224 are read from or written to by the I/O circuit 110 while the I/O circuit 110 is granted access. By way of example, during a read operation, the I/O circuit 110 senses the voltage applied at the first terminal 222 by the first memory node 216 and the voltage applied at second terminal 230 by the second memory node 224. As another example, during a write operation, the I/O circuit 110 applies programming voltages to the first memory node 216 and the second memory node 224 via the first terminal 222 and the second terminal 230.

While FIG. 1 describes a two-layer memory arrangement wherein the memory array 102 is situated on a first physical layer and the driver array is situated on a second physical layer, the memory arrangement is not intended to be limited to a two-layer arrangement.

Figure 3:
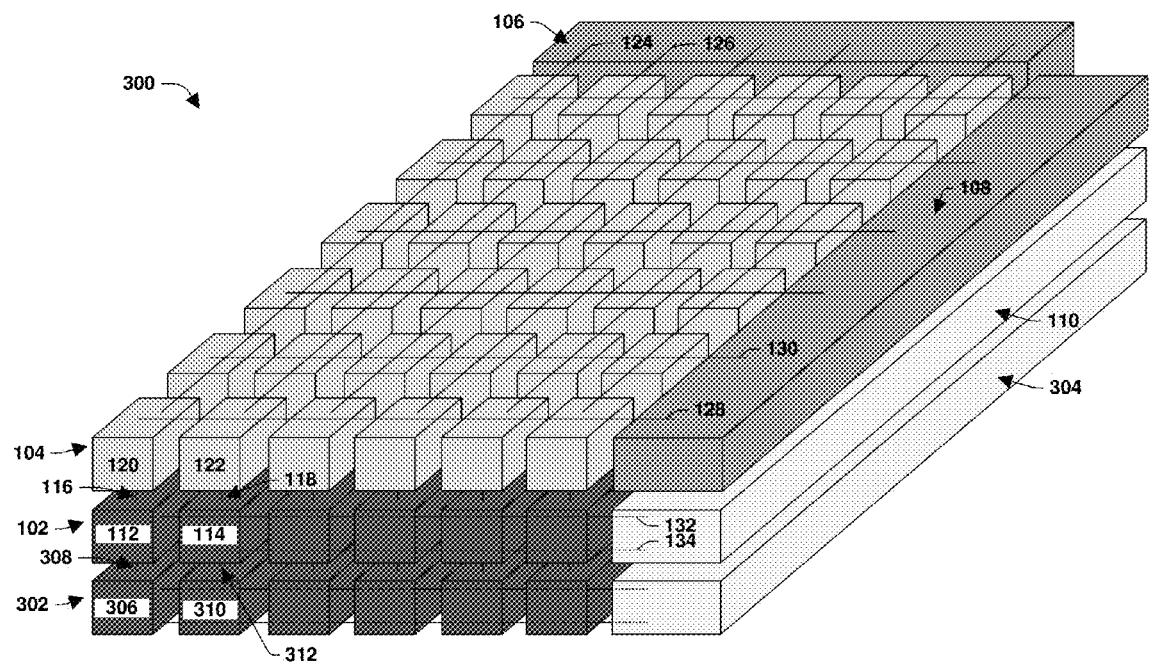
FIG. 3 illustrates a memory arrangement according to some embodiments.

Referring to FIG. 3, a three-layer memory arrangement 300 according to some embodiments is provided. A first physical layer of the three-layer memory arrangement 300 comprises the first memory array 102 and the I/O circuit 110. A second physical layer of the three-layer memory arrangement 300 comprises the driver array 104, the first decoder 106, and the second decoder 108. A third physical layer of the three-layer memory arrangement 300 comprises a second memory array 302 and a second I/O circuit 304. In some embodiments, the second memory array 302 is situated adjacent the first memory array 102. In other embodiments, the driver array 104 is situated between the first memory array 102 and the second memory array 302.

In some embodiments, a memory cell of the first memory array 102 and a memory cell of the second memory array 302 are respectively operably coupled to a same word-line driver of the driver array 104. By way of example, the first memory cell 112 of the first memory array 102 is operably coupled to the first word-line driver 120 via the first word-line 116 and a third memory cell 306 of the second memory array 302 is operably coupled to the first word-line driver 120 via a third word-line 308. The first word-line 116 and the third word-line 308 are operably coupled to the first word-line driver 120 at the first output terminal 244, for example. As another example, the second memory cell 114 of the first memory array 102 is operably coupled to the second word-line driver 122 via the second word-line 118 and a fourth memory cell 310 of the second memory array 302 is operably coupled to the second word-line driver 122 via a fourth word-line 312.

In some embodiments, a vertically arranged set of memory cells is referred to as a memory stack. For example, the first memory cell 112 and the third memory cell 306 form a first memory stack that is controlled by the first word-line driver 120. As another example, the second memory cell 114 and the fourth memory cell 310 form a second memory stack that is controlled by the second word-line driver 122. The number of memory cells comprised within a memory stack is any integer greater than or equal to 1. By way of example, where the memory arrangement is a six-layer memory arrangement comprising 5 memory arrays respectively situated on a different physical layer, the number of memory cells that form a stack is 5.

In some embodiments, memory cells of the first array are controlled by a different set of word-line drivers than memory cells of the second array. By way of example, a four-layer memory arrangement comprises two driver arrays and two memory arrays. Word-line drivers of a first driver array control activation of memory cells of a first memory array and word-line drivers of a second driver array control activation of memory cells of a second memory array.

Figure 4:
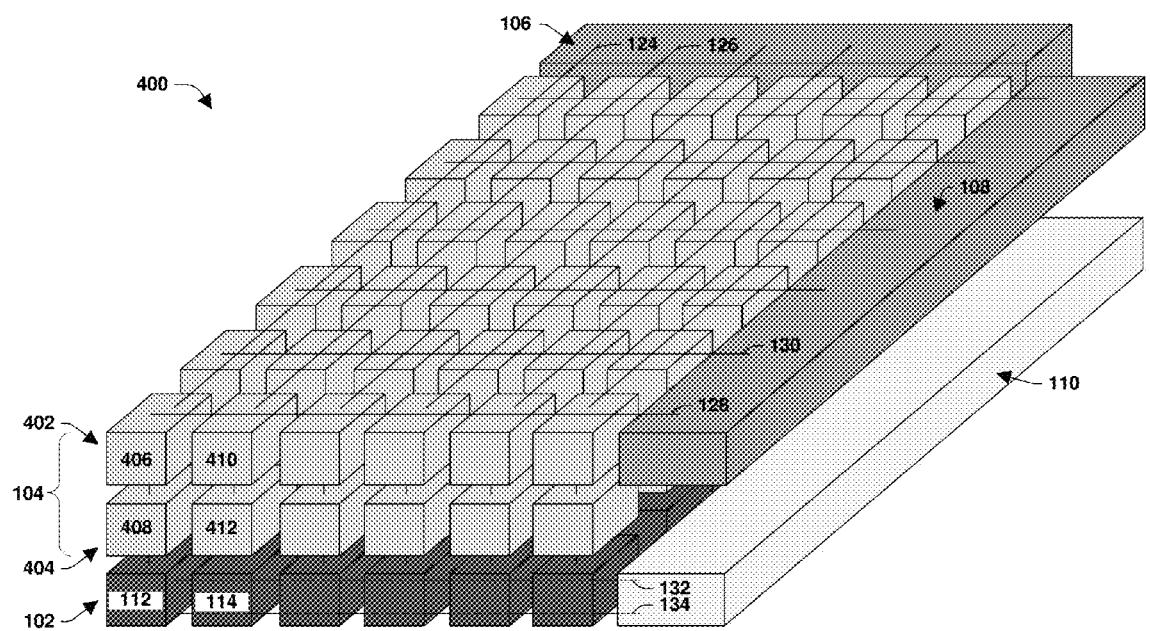
FIG. 4 illustrates a memory arrangement according to some embodiments.

Referring to FIG. 4, another three-layer memory arrangement 400 according to some embodiments is provided. A first physical layer of the three-layer memory arrangement 400 comprises the first memory array 102 and the I/O circuit 110. A second physical layer of the three-layer memory arrangement 400 comprises a first portion 402 of the driver array 104, the first decoder 106, and the second decoder 108. A fourth physical layer of the three-layer memory arrangement 300 comprises a second portion 404 of the driver array 104. In some embodiments, the second portion 404 of the driver array 104 is situated adjacent the first portion 402 of the driver array 104. In other embodiments, the memory array 102 is situated between the first portion 402 of the driver array 104 and the second portion 404 of the driver array 104.

The first portion 402 of the driver array 104 comprises a first set of elements and the second portion 404 of the driver array 104 comprises a second set of elements. In some embodiments, a word-line driver comprises an element of the first portion 402 and an element of the second portion 404. By way of example, the first word-line driver 120 comprises a first element 406 situated on the second physical layer and a second element 408 situated on the fourth physical layer. As another example, the second word-line driver 122 comprises a third element 410 situated on the second physical layer and a fourth element 412 situated on the fourth physical layer.

In some embodiments, a vertically arranged set of element is referred to as a driver stack and a word-line driver is formed from at least one driver stack. By way of example, the first element 406 and the second element represent a first driver stack which forms the first word-line driver 120. As another example, the third element 410 and the fourth element 412 represent a second driver stack which forms the second word-line driver 122.

In some embodiments, elements of the first set of elements and elements of the second set of elements are configured to perform different functions. By way of example, the elements of the first set of elements are configured to perform a logic function, such as evaluating two or more voltage signals applied at the inputs of the word-line drivers to generate a gate voltage signal, and elements of the second set of elements are configured to alter the gate voltage signal. By way of example, the elements of the second set of elements are configured to increase drive capabilities of the word-line drivers by accelerating a transition time of a gate voltage signal between a LOW voltage state and a HIGH voltage state.

Figure 5:
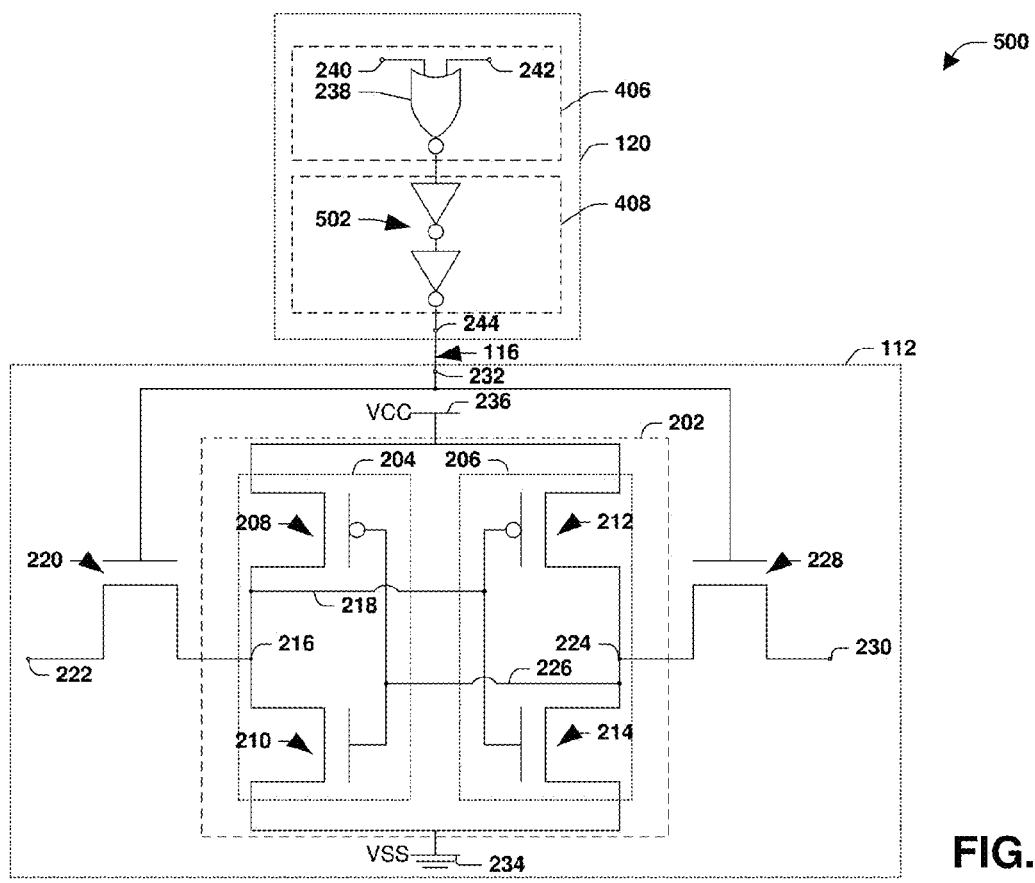
FIG. 5 illustrates a circuit diagram of a portion of a memory arrangement according to some embodiments.

Referring to FIG. 5, a circuit diagram 500 of a portion of an example memory arrangement, such as a portion of the memory arrangement 400 of FIG. 4 is provided. More particularly, a circuit diagram 500 of the first memory cell 112, the first word-line 116, and the first word-line driver 120 according to some embodiments is provided. For purposes of brevity, features and/or aspects of the circuit diagram 500 that were described with respect to FIG. 2 are not described with respect to FIG. 5.

The first word-line driver 120 comprises the first element 406 and the second element 408. The first element 406 comprises a first input terminal 240 operably coupled to the first decoder 106, a second input terminal 242 operably coupled to the second decoder 108, and a first logic gate 238. In the circuit diagram 500, the first logic gate 238 is a NOR gate, although other logic gates are contemplated. The second element 408 comprises a second logic gate 502 and the output terminal 244. In the circuit diagram 500, the second logic gate 502 is a buffer comprising two inverters arranged in series, although other logic gates are contemplated.

The first logic gate 238 is configured to evaluate or measure the first voltage signal applied at the first input terminal 240 and the second voltage signal applied at the second input terminal 242 to generate an output and the second logic gate 502 is configured to increase a driving capability of the first word-line driver 120. By way of example, the second logic gate 502 reduces a transition time in the gate voltage signal between a HIGH voltage state and a LOW voltage state.

Figure 6:
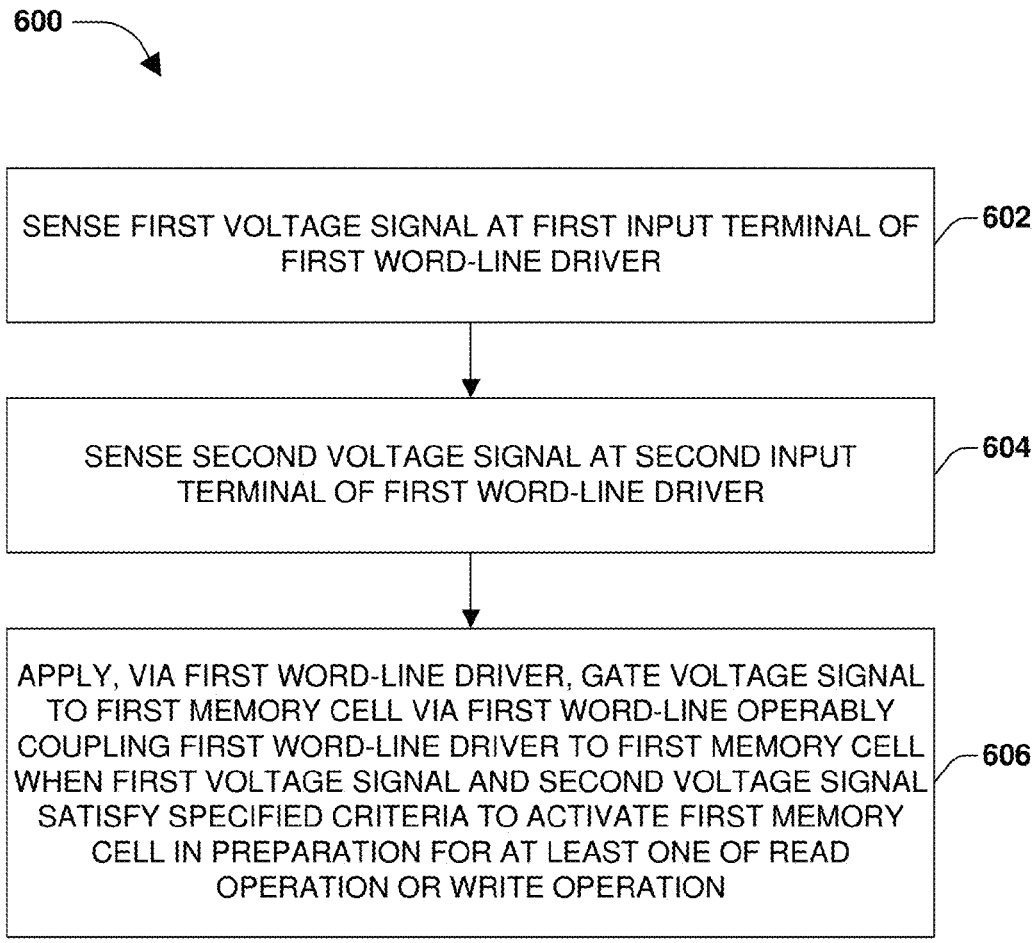
FIG. 6 illustrates a flow diagram of a method for activating a first memory cell in preparation for at least one of a read operation or write operation according to some embodiments.

Referring to FIG. 6, a flow diagram of a method 600 for activating a first memory cell in preparation for at least one of a read operation or write operation according to some embodiments is illustrated. At 602 in the method 600, a first voltage signal is sensed at a first input terminal of a first word-line driver and a second voltage signal is sensed at a second input terminal of the first word-line driver at 604. At 606 in the example method 600, a gate voltage signal having a specified amplitude is applied to the first memory cell, via a first word-line operably coupling the first word-line driver to the first memory cell, when the first voltage signal and the second voltage signal satisfy specified criteria. By way of example, the first word-line driver is configured to output a HIGH gate voltage signal when the first voltage signal is HIGH and the second voltage signal is HIGH. At other times, the first word-line driver is configured to output a LOW gate voltage signal. The HIGH gate voltage signal is configured to activate the first memory cell in preparation for at least one of the read operation or the write operation. The LOW gate voltage signal is configured to deactivate the first memory cell.

Figure 7:
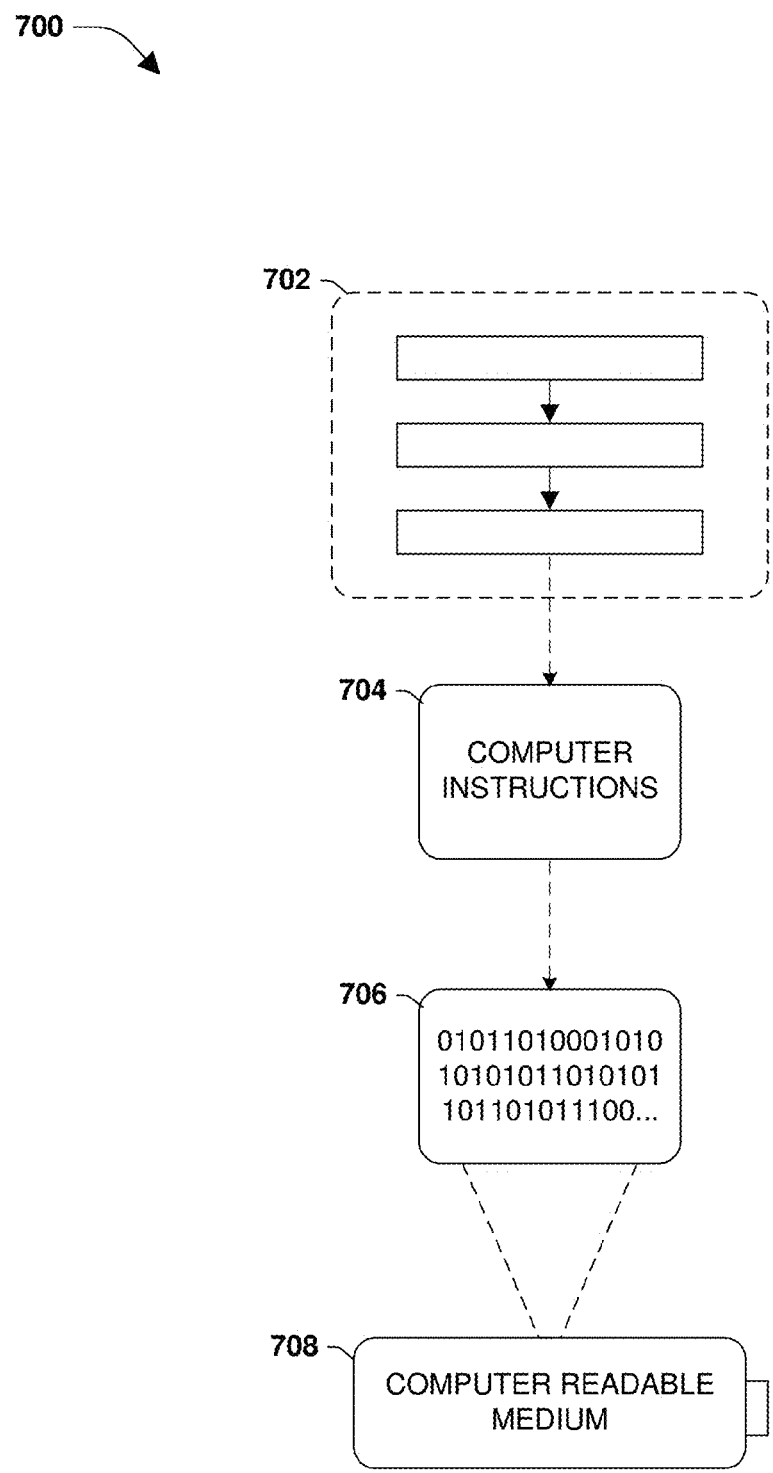
FIG. 7 is a diagram illustrating an example computer-readable medium, comprising processor-executable instructions configured to embody one or more of the provisions set forth herein according to some embodiments.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 7, wherein an implementation 700 comprises a computer-readable medium 708, such as a CD-R, DVD-R, flash drive, a platter of a hard disk drive, etc., on which is encoded computer-readable data 706. This computer-readable data 706, such as binary data comprising a plurality of zero's and one's as shown in 706, in turn comprises a set of processor-executable instructions 704 which when executed via one or more processing units are configured to operate according to one or more of the principles set forth herein. In some embodiments 700, the processor-executable instructions 704 are configured to perform an operation 702, such as at least some of the method 600 of FIG. 6. In other embodiments, the processor-executable instructions 704 are configured to implement a system such as at least some of the memory arrangement 100 of FIG. 1, at least some of the memory arrangement 300 of FIG. 3, or at least some of the memory arrangement 400 of FIG. 4. Many such computer-readable media are devised by those of ordinary skill in the art that are configured to operate in accordance with the techniques presented herein.

According to an aspect of the instant disclosure, a memory arrangement is provided. The memory arrangement comprises a first memory cell configured to store content and a first word-line driver operably coupled to a first decoder and a second decoder. The first word-line driver is configured to activate the first memory cell as a function of a first voltage signal applied to the first word-line driver via the first decoder and a second voltage signal applied to the first word-line driver via the second decoder.

According to another aspect of the instant disclosure, a memory arrangement is provided. The memory arrangement comprises a first memory cell configured to store content and situated on a first physical layer of the memory arrangement. The memory arrangement also comprises a first word-line driver operably coupled to a first decoder and a second decoder and situated on at least a second physical layer of the memory arrangement. The first word-line driver is configured to activate the first memory cell as a function of a first voltage signal applied to the first word-line driver via the first decoder and a second voltage signal applied to the first word-line driver via a second decoder.

According to yet another aspect of the instant disclosure, a method for activating a first memory cell in preparation for at least one of a read operation or write operation is provided. The method comprises sensing a first voltage signal at a first input terminal of a first word-line driver and sensing a second voltage signal at a second input terminal of the first word-line driver. The method also comprises applying, via the first word-line driver, a gate voltage signal to the first memory cell via a first word-line operably coupling the first word-line driver to the first memory cell when the first voltage signal and the second voltage signal satisfy specified criteria to activate the first memory cell in preparation for the at least one of a read operation or a write operation.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or identical channels or the same channel It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A memory arrangement, comprising:
   a memory cell configured to store content; and
   a word-line driver having a first input terminal coupled to a first decoder and a second input terminal coupled to a second decoder, wherein:
      the word-line driver controls activation and deactivation of the memory cell based upon a first signal applied to the word-line driver by the first decoder in combination with a second signal applied to the word-line driver by the second decoder, and
      the word-line driver is configured to maintain the memory cell in a deactivated state when a logical state of the first signal is different than a logical state of the second signal.

2. The memory arrangement of claim 1, wherein the word-line driver is situated on a first physical layer of the memory arrangement and the memory cell is situated on a second physical layer of the memory arrangement.

3. The memory arrangement of claim 1, wherein the word-line driver comprises a logic gate.

4. The memory arrangement of claim 1, wherein the memory cell is a single-port memory cell.

5. The memory arrangement of claim 1, wherein the memory cell is situated on a first physical layer of the memory arrangement and the word-line driver is configured to control activation and deactivation of a second memory cell situated on a second physical layer of the memory arrangement.

6. The memory arrangement of claim 5, wherein the word-line driver is situated on a third physical layer of the memory arrangement.

7. The memory arrangement of claim 1, wherein the memory cell is a static random access memory (SRAM) cell.

8. The memory arrangement of claim 1, wherein the memory cell is situated on a first physical layer of the memory arrangement, a first portion of the word-line driver is situated on a second physical layer of the memory arrangement, and a second portion of the word-line driver is situated on a third physical layer of the memory arrangement.

9. The memory arrangement of claim 8, wherein the first portion of the word-line driver is a first logic gate and the second portion of the word-line driver is a second logic gate.

10. A memory arrangement, comprising:
    a memory cell configured to store content; and
    a word-line driver configured to maintain the memory cell in a deactivated state when a logical input applied to a first input terminal of the word-line driver is different than a logical input applied to a second input terminal of the word-line driver.

11. The memory arrangement of claim 10, wherein the word-line driver is configured to maintain the memory cell in an activated state when the logical input applied to the first input terminal is substantially equal to the logical input applied to the second input terminal.

12. The memory arrangement of claim 10, the word-line driver situated on a first physical layer of the memory arrangement and the memory cell situated on a second physical layer of the memory arrangement.

13. The memory arrangement of claim 10, wherein the memory cell is a static random access memory (SRAM) cell.

14. The memory arrangement of claim 10, the word-line driver comprising a logic gate.

15. The memory arrangement of claim 10, wherein the memory cell is situated on a first physical layer of the memory arrangement, a first portion of the word-line driver is situated on a second physical layer of the memory arrangement, and a second portion of the word-line driver is situated on a third physical layer of the memory arrangement.

16. A memory arrangement, comprising,
    a memory cell configured to store content; and
    a word-line driver configured to control activation of the memory cell as a function of a first signal applied to a first input terminal of the word-line driver and a second signal applied to a second input terminal of the word-line driver, the word-line driver situated on a first physical layer of the memory arrangement and the memory cell situated on a second physical layer of the memory arrangement.

17. The memory arrangement of claim 16, wherein the word-line driver is configured to maintain the memory cell in a deactivated state when a logical state of the first signal is different than a logical state of the second signal.

18. The memory arrangement of claim 16, wherein the word-line driver is configured to control activation of a second memory cell situated on a third physical layer of the memory arrangement.

19. The memory arrangement of claim 18, wherein the word-line driver is configured to control the activation of the second memory cell as a function of the first signal applied to the first input terminal and the second signal applied to the second input terminal.

20. The memory arrangement of claim 16, wherein the word-line driver is divided into a first portion and a second portion, the first portion of the word-line driver is situated on the first physical layer of the memory arrangement, and the second portion of the word-line driver is situated on a third physical layer of the memory arrangement.

21. A memory arrangement, comprising:
   a memory cell configured to store content; and
   a word-line driver having a first input terminal coupled to a first decoder and a second input terminal coupled to a second decoder, wherein:
      the word-line driver controls activation and deactivation of the memory cell based upon a first signal applied to the word-line driver by the first decoder in combination with a second signal applied to the word-line driver by the second decoder,
      the memory cell is situated on a first physical layer of the memory arrangement, and
      the word-line driver is further configured to control activation and deactivation of a second memory cell situated on a second physical layer of the memory arrangement.

22. The memory arrangement of claim 21, wherein the word-line driver is situated on a third physical layer of the memory arrangement.

\* \* \* \* \*

UNITED STATES PATENT AND TRADEMARK OFFICE
CERTIFICATE OF CORRECTION

PATENT NO. : 9,536,598 B2  
APPLICATION NO. : 14/886475  
DATED : January 3, 2017  
INVENTOR(S) : Wei-Cheng Wu et al.

Page 1 of 1

It is certified that error appears in the above-identified patent and that said Letters Patent is hereby corrected as shown below:

On the Title Page

In item (73) titled Assignee: please delete "Limi," and insert therefor --Limited,--

Signed and Sealed this
Twenty-third Day of May, 2017

Michelle K. Lee
*Director of the United States Patent and Trademark Office*